United States Patent [19]

Nakayama et al.

[11] Patent Number: 4,988,573
[45] Date of Patent: Jan. 29, 1991

[54] MEDIUM RELATED MEMBERS

[75] Inventors: Masatoshi Nakayama; Kunihiro Ueda; Masatoshi Okamura, all of Saku, Japan

[73] Assignee: TDK Corporation, Tokyo, Japan

[21] Appl. No.: 379,344

[22] Filed: Jul. 13, 1989

[30] Foreign Application Priority Data

Jul. 14, 1988 [JP] Japan ................................. 63-175686
Jul. 14, 1988 [JP] Japan ................................. 63-175687

[51] Int. Cl.⁵ ............................................ B32B 27/06
[52] U.S. Cl. ..................................... 428/421; 427/44; 428/422; 428/447; 428/463; 428/704
[58] Field of Search ............... 428/421, 422, 447, 704, 428/463; 427/44

[56] References Cited

FOREIGN PATENT DOCUMENTS 58-222114 12/1983 Japan .
58-222115 12/1983 Japan .

OTHER PUBLICATIONS

English Translation of Japanese Laid Open Patent Application 58/222114, Dec. 23, 1983, Nakawama et al.
English Translation of Japanese Laid Open Patent Application 58/222115, Dec. 23, 1983, Nakawama et al.

Primary Examiner—Thomas J. Herbert
Attorney, Agent, or Firm—Oblon, Spivak, McClelland, Maier & Neustadt

[57] ABSTRACT

A plasma-polymerized film covers a surface of a medium related member which constructs or is disposed in a casing in which a tape or disk-shaped recording medium is receiving for travel or rotating motion. The film contains C, F and at least one element of Si, B, P and N. The total content of F and at least one element of Si, B, P, and N ranges from 5 to 40 atom % of the film, and the atomic ratio of $(Si+B+P+N)/F$ ranges from 2/10 to 5/1.

2 Claims, 3 Drawing Sheets

MEDIUM RELATED MEMBERS

BACKGROUND OF THE INVENTION

1. Field of the Invention

This invention relates to members having a plasma-polymerized film as a surface coating for use with media capable of recording and/or reproduction of information utilizing magnetism, light or the like, for example, casings or cartridges for video, audio and computer tape and disks.

2. Discussion of Prior Art

Various information recording/reproducing carriers including video cassettes, audio cassettes, computer cartridges, video floppy disks, and laser vision disks are of the design that a tape or disk-shaped recording/reproducing medium is received in a casing such that the medium may travel or rotate in the casing or recording-/reproducing equipment. More particularly, within these recording/ reproducing carriers, the recording-/reproducing medium moves in sliding contact with members constructing or disposed in the casing, and these members in the casing make mutual slide contact during operation.

In the case of video tape cassettes, for example, the cassette casing has received therein a recording medium in the form of video tape and various members including reels on which the tape is wound, brakes for locking the reels, and guide posts and tape guides for guiding the tape during operation. When the recording/reproducing equipment is loaded with the medium for operation, the video tape makes slide contact with the tape travel guide members such as guide posts and tape guides, and the reels make contact with reel-retaining leaf springs.

To ensure that the travel or rotation of the medium in the form of tape or disk be accurate, smooth and stable, these members have to meet the following requirements:

(A) a low coefficient of friction, (B) sufficient abrasion resistance and surface hardness to minimize abrasion of the members and the tape which would cause dropouts, and (C) antistatic properties to prevent build-up of static charge which would cause recording/reproducing malfunctions.

In the prior art, the casing members are formed from resinous material because of ease of molding and light weight. To meet the above requirements, the members are provided with antistatic coatings on the surface, replaced by abrasion resistant metal parts for the necessary portions, or provided with metal coatings. However, formation of an antistatic coating has problems including difficulty of coating a uniformly thin film and blooming. Partial replacement of the members by metal parts has problems including an increased number of steps, increased cost, and difficulty of processing a complex shape.

Under the circumstances, the inventors previously proposed to form plasma-polymerized films of organo-metallic compounds (Japanese Patent Application Kokai No. 222115/ 1983) and silicon compounds (Japanese Patent Application Kokai No. 222114/1983) on such members. For these films, nevertheless, only antistatic property is taken into account while no evaluation is made on dynamic friction during operation.

SUMMARY OF THE INVENTION

An object of the present invention is to provide a member for use with a recording/reproducing medium, which is highly antistatic and durable, ensures accurate, smooth and stable operation of the medium, causes minimized dropouts upon recording/reproducing operation, and invites no further increase of part and step numbers.

The present invention provides a medium related member which constructs or is disposed in a casing in which a tape or disk-shaped medium is received for travel or rotating motion. According to the feature of the present invention, a plasma-polymerized film containing C, F and at least one element of Si, B, P, and N is formed on a surface of the member. The total content of F and at least one element of Si, B, P, and N ranges from 5 to 40 atom % of the film, and the atomic ratio of $(Si+B+P+N)/F$ ranges from 2/10 to 5/1. Preferably, the plasma-polymerized film may further contain H with an atomic ratio of C/H of up to 2/1.

BRIEF DESCRIPTION OF THE DRAWINGS

The above and other objects, features, and advantages of the present invention will be better understood from the following description taken in conjunction with the accompanying drawings.

DETAILED DESCRIPTION OF THE INVENTION

The medium related member of the present invention is a member which constructs or is disposed in a casing in which a tape or disk-shaped medium is received for travel or rotating motion. A plasma-polymerized film as will be defined later in detail is formed on a surface of the member.

Figure 1:
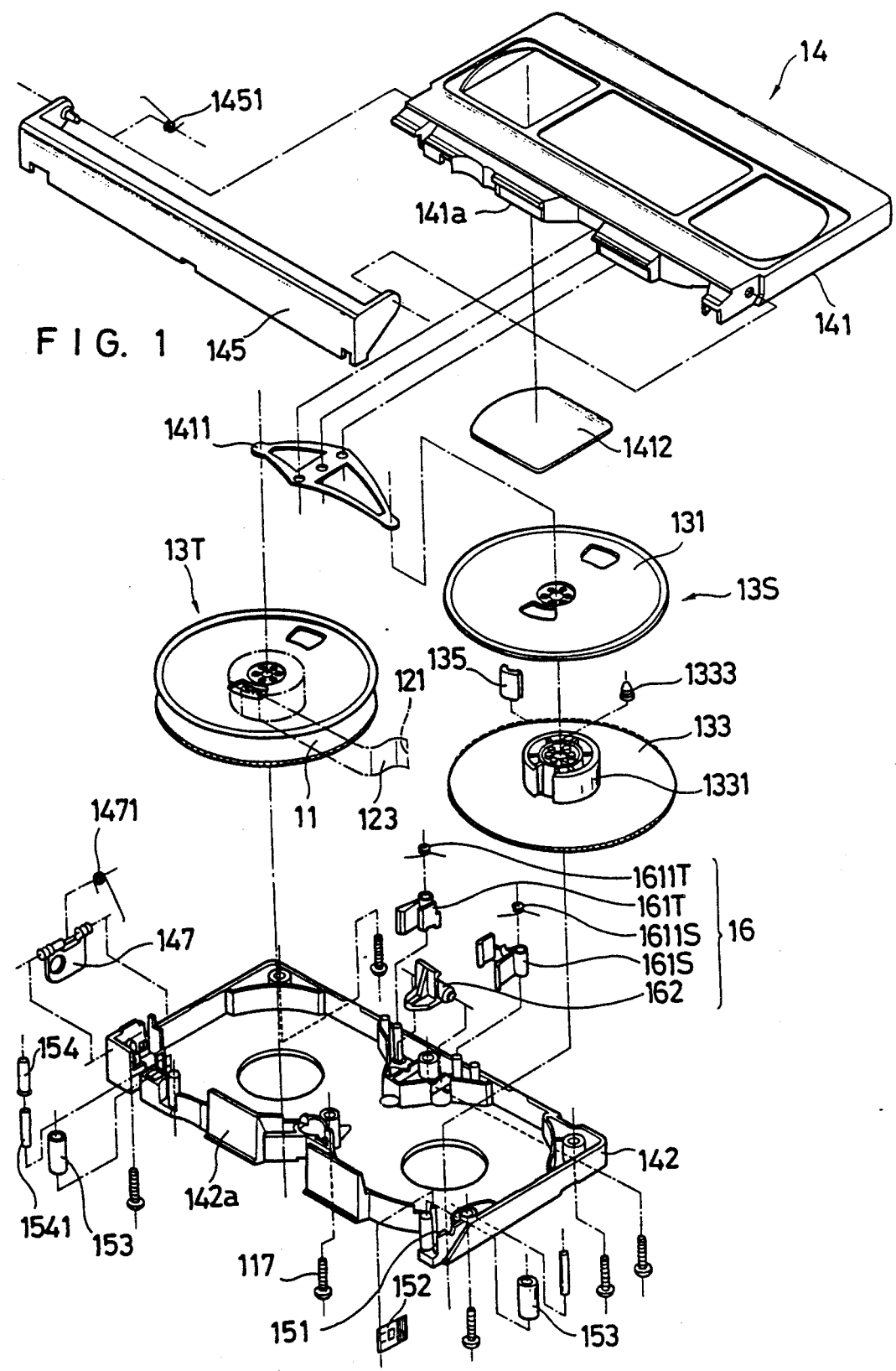
FIG. 1 is a perspective exploded view showing the structure of a VHS video cassette using medium related members according to the present invention.

FIG. 1 illustrates one embodiment in which the medium related members of the invention are applied to a video tape cassette. There are illustrated a recording tape 11, leader/trailer tape 121, adhesive tape 123, supply reel 13S, take-up reel 13T, reel flange 131, reel hub 133, hub portion 1331, reel center boss 1333, tape clamp 135, upper cassette half 141, reel-retaining leaf spring 1411, clear window 1412, lower cassette half 142, guard panel 145, guard panel spring 1451, lock plate 147, lock plate spring 1471, guide post 151, tape pad 152, tape guide 153, guide roller 154, guide roller pin 1541, brake lever 161, brake spring 1611, and release lever 162.

In this embodiment, the medium is a length of magnetic tape 11 having a magnetic layer on a flexible substrate and the casing is a cassette 14.

The video cassette 14 shown in FIG. 1 includes upper and lower cassette halves 141 and 142 and a guard panel 145 assembled by means of tapping screws 117. These members form the casing according to the present invention. Disposed within the cassette 14 are a supply reel 13S having the tape wound thereon, a take-up reel 13T for taking up the tape, and a brake assembly 16 for preventing rotation of the reels 13 except operating periods. There are disposed many other members including travel guide members including tape guides 153 and guide rollers 154.

The supply and take-up reels 13S and 13T are juxtaposed in the cassette and biased against the lower cassette half 142 by a leaf spring 1411. The brake assembly 16 is disposed above and intermediate the reels. The tape travel guide members including tape guides 153 and guide rollers 154 are disposed near outlet and inlet ports through which the tape is pulled out of and into the cassette.

A leader/trailer tape section 121 is to connect the magnetic tape 11 to the supply reel 13S. The magnetic tape 11 from the supply reel 13S is extended between a guide post 151 and a tape pad 152 under a moderate back tension imparted by the tape pad 152, and pulled into the recording/ reproducing equipment through the tape outlet port in contact with the tape guide 153. The tape which has traveled past the recording/reproducing equipment is passed between the tape guide 153 and the guide roller 154 and then wound up on the take-up reel 13T.

In the video cassette generally having a structure as illustrated above, most of the members constructing the cassette make slide contact with the recording tape 11 or with each other.

According to the present invention, a desired plasma-polymerized film is formed on surfaces of members constructing the video cassette. Among them, those members which are expected of better performance when coated with the desired plasma-polymerized film on their surface are the travel guide members in contact with the recording tape 11 including guide post 151, tape pad 152, tape guide 153, and guide roller 154, leader/trailer tape section 121 connected to the recording tape 11, a reel center boss 1333 in contact with the leaf spring 1411, and front end portions 141a and 142a of upper and lower cassette halves 141 and 142.

Figure 2:
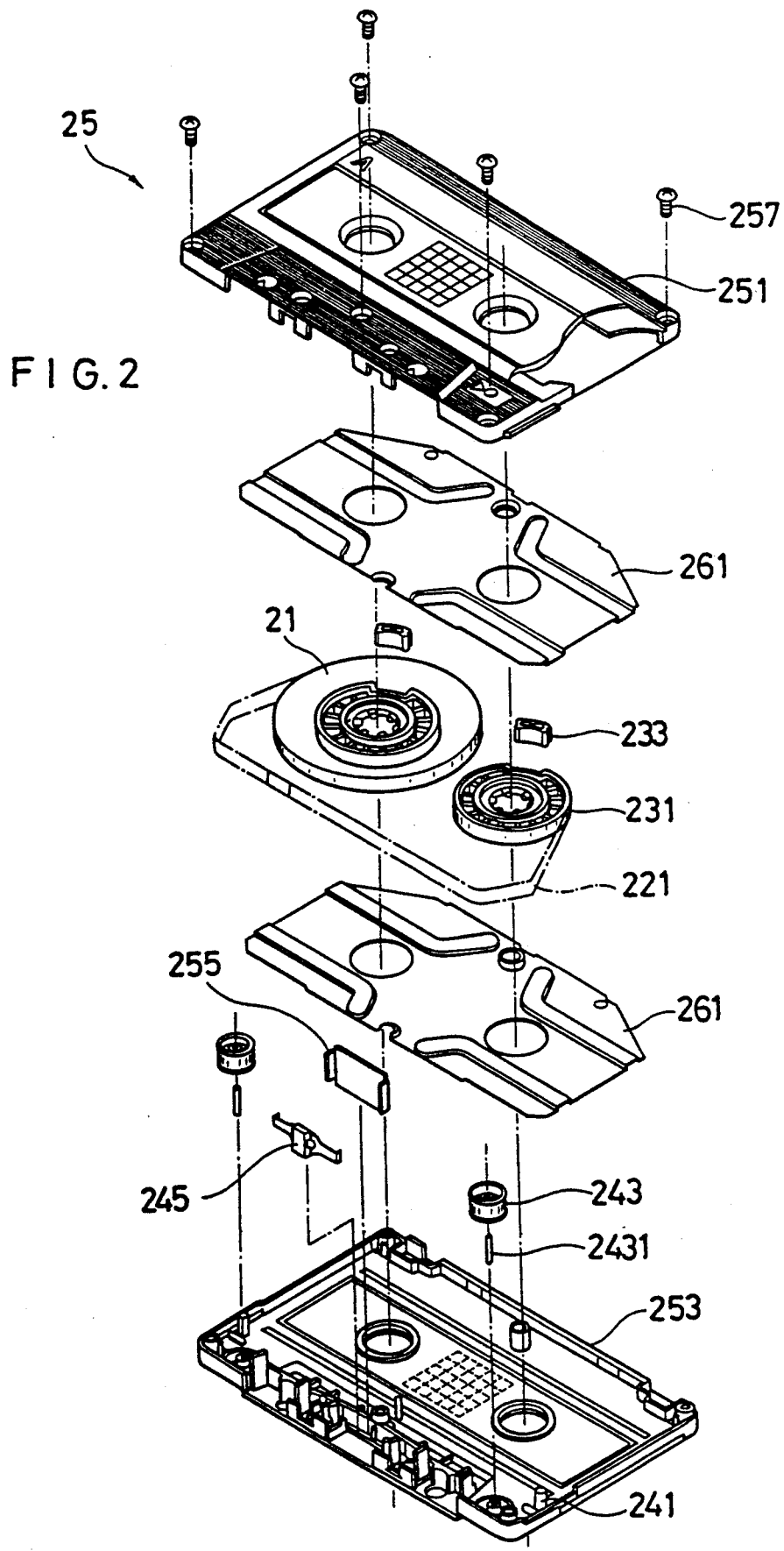
FIG. 2 is a perspective exploded view showing the structure of an audio cassette using medium related members according to the present invention.

FIG. 2 illustrates another embodiment in which the medium related members of the invention are applied to an audio tape cassette. There are illustrated a recording tape 21, leader tape 221, hub 231, clamp 233, guide pin 241, guide roller 243, guide roller pin 2431, head pad 245, half side A 251, half side B 253, shield plate 255, tapping screw 257, and sheet 261.

In this embodiment, the medium is a length of magnetic tape 21 having a magnetic layer on a flexible substrate and the casing is a cassette 25 like the video cassette.

The audio cassette 25 shown in FIG. 2 includes A and B side cassette halves 251 and 253 assembled. These members form the casing according to the present invention. Disposed within the cassette 25 are hubs 231, 233 on which the tape is wound or unwound, and guide rollers 243 and guide pins 241 for guiding the tape during its travel. There are disposed many other members including sheets 261 assisting in tight, accurate, smooth, antistatic winding and unwinding of the tape, and leader tape sections 221 connecting the magnetic tape 21 to the hubs 231, 233.

The tape from one hub 231 is extended along the travel path via the guide pin 241 and guide roller 243 and enters an operation zone where it is brought in contact with a head of the recording/reproducing equipment. A head pad 245 forces the tape in slide contact with the head. Then the tape is extended along the travel path via the guide pin 241 and guide roller 243 and wound on the other hub 231.

According to the present invention, a desired plasma-polymerized film is formed on surfaces of members constructing the audio cassette as in the case of the video cassette. Among them, those members which are expected of better performance when coated with the desired plasma-polymerized film on their surface are the travel guide members including guide pins 241 and guide rollers 243, leader tape sections 221, and sheets 261.

The present invention is effectively applicable to not only the above-illustrated video and audio cassettes, but also various other video cassettes, audio cassettes, and computer cartridges which have a similar type of magnetic tape and similar members. In addition, the present invention is also effective in applying to members for use with various disk-shaped media such as floppy disks, hard disks, and compact disks as well as cleaning cassettes.

According to the present invention, the plasma-polymerized film which is coated on the surface of the member should contain carbon (C), fluorine (F) and at least one element of silicon (Si), boron (B), phosphorus (P), and nitrogen (N), preferably carbon (C), hydrogen (H), fluorine (F) and at least one element of silicon (Si), boron (B), phosphorus (P), and nitrogen (N).

The total content of F and at least one element of Si, B, P, and N should range from about 5 to about 40 atom %, preferably from about 10 to about 35 atom % of the film. The atomic ratio of $(Si+B+P+N)/F$ should range from about 2/10 to about 5/1, preferably from about 3/10 to about 3/1. A film with a total $F+Si+B+P+N$ content of less than 5 atom % becomes less antistatic even when the atomic ratio of $(Si+B+P+N)/F$ is properly controlled, whereas a film with a total $F+Si+B+P+N$ content of more than 40 atom % becomes physically too weak to render the member durable. The atomic ratio of $(Si+B+P+N)/F$ is critical for the film to provide an antistatic function.

When the film contains more than one element of Si, B, P, and N, they may be present in any desired mutual ratio.

The balance of the film other than F and at least one element of Si, B, P, and N may consist of C alone or C plus H. In the latter case, the atomic ratio of H/C should preferably range up to about 2/1, more preferably from about 5/100 to about 2/1.

In the practice of the present invention, the atomic contents of C, Si, B, P, F, N and H in the plasma-polymerized film may be analyzed by the secondary ion mass spectroscopy (SIMS). The contents can be determined by SIMS analysis by counting C, Si, B, P, F, N, H, and other elements at the surface of the plasma-polymerized film because the film is preferably as thin as about 10 to about 1,000 Å. Alternatively, the contents can be determined by measuring the profiles of C, Si, B, P, F, N, H, and other elements while ion etching with Ar or the like.

With respect to the SIMS measurement, reference is made to the article entitled "SIMS and LAMMA" in Hyomen Kagaku Kiso Kouza, 1984, vol. 3, Hyomen Bunseki No Kiso To Ouyou (Surface Science Basic Lectures, Vol 3, 1984, Fundamentals and Applications of Surface Analysis, page 70).

The plasma-polymerized film of the above-defined composition preferably has a thickness of from about 10 to about 1,000 Å, more preferably from about 20 to about 100 Å. Thicker films in excess of 1,000 Å would often have reduced strength due to the remaining internal stresses induced during film formation and thus be liable to abrasion, causing dropouts. Films of less than 10 Å are too thin for the purpose of the invention, failing to provide durability, scratch resistance, and abrasion resistance, all causing dropouts. Such too thin films also present a poor surface state. It is to be noted that the film thickness can be measured by means of an ellipsometer or the like.

The film can be formed to a proper thickness by controlling reaction time, reactant gas flow rate, and other parameters during plasma polymerization.

The film is generally formed by plasma polymerizing a corresponding reactant or a properly combined set of reactants. Most often, reactants containing the essential elements are used in a proper combination to form the desired film.

Examples of the reactants which can be used for plasma polymerization in the practice of the invention are given below.

(1) Siloxanes

Tetramethoxysilane, tetraethoxysilane, octamethylcyclotetrasiloxane, hexamethylcyclosiloxane, hexamethoxydisiloxane, hexaethoxydisiloxane, triethoxyvinylsilane, dimethylethoxyvinylsilane, trimethoxyvinylsilane, methyltrimethoxysilane, dimethoxymethylchlorosilane, dimethoxymethylsilane, trimethoxysilane, dimethylethoxysilane, trimethoxysilanol, hydroxymethyltrimethylsilane, methoxytrimethylsilane, dimethoxydimethylsilane, ethoxytrimethoxysilane, bis(2-chloroethoxy)methylsilane, acetoxytrimethylsilane, chloromethyldimethylethoxysilane, 2-chloroethoxytrimethylsilane, ethoxytrimethylsilane, diethoxymethylsilane, ethyltrimethoxysilane, tris(2-chloroethoxy)silane, dimethoxymethyl-3,3,3-trifluoropropylsilane, 1-chloromethyl-2-chloroethoxytrimethylsilane, allyloxytrimethylsilane, ethoxydimethylvinylsilane, isopropylphenoxytrimethylsilane, 3-chloropropyldimethoxymethylsilane, chloromethyldiethoxymethylsilane, triethoxychlorosilane, 3-chloropropyltrimethoxysilane, diethoxydimethylsilane, dimethoxy-3-mercaptopropylmethylsilane, triethoxysilane, 3-mercapto-propyltrimethoxysilane, 3-aminopropyltrimethoxysilane, diethoxymethylvinylsilane, chloromethyltriethoxysilane, tert.-butoxytrimethylsilane, butyltrimethoxysilane, methyltriethoxysilane, 3-(N-methylaminopropyl)triethoxysilane, diethoxydivinylsilane, diethoxydiethylsilane, ethyltriethoxysilane, 2-mercaptoethyltriethoxysilane, 3-aminopropyldiethoxymethylsilane, p-chlorophenyltriethoxysilane, phenyltrimethoxysilane, 2-cyanoethyltriethoxysilane, allyltriethoxysilane, 3-chloropropyltriethoxysilane, 3-allylaminopropyltrimethoxysilane, propyltriethoxysilane, hexatrimethoxysilane, 3-aminopropyltriethoxysilane, 3-methylacryloxypropyltrimethoxysilane, methyltris(2-methoxyethoxy)silane, diethoxymethylphenylsilane, p-chlorophenyltriethoxysilane, phenyltriethoxysilane, tetraallyloxysilane, tetrapropoxysilane, tetraisopropoxysilane, dimethoxydiphenylsilane, diethoxydiphenylsilane, tetraphenoxysilane, 1,1,3,3-tetramethyldisiloxane, hexamethyldisiloxane, octamethyltrisiloxane, 1,1,1,3,5,5,5-heptamethyltrisiloxane, hexaethylcyclotrisiloxane, 1,3,5-trimethyl-1,3,5-triphenylcyclotrisiloxane, octamethylcyclotetrasiloxane, hexamethylcyclosiloxane, etc.

(2) Silanes

Silane, vinyltrichlorosilane, dimethyldichlorosilane, methylthiotrimethylsilane, dimethylpropylchlorosilane, diallyldichlorosilane, butyldimethylsilane, tetraethylsilane, hexamethyldisilane, tetramethylsilane, diethylsilane, ethynyltrimethylsilane, allyldimethylchlorosilane, trimethylvinylsilane, diethylmethylsilane, dimethylaminotrimethylsilane, triethylsilane, allyltrimethylsilane, methyltrivinylsilane, tetravinylsilane, phenyltrimethylsilane, hexamethyldisilazane, 1,1,3,3-tetramethyldisilazane, 1,1,3,3,5,5-hexamethylcyclotrisilazane, 1,1,3,3,5,5,7,7-octamethylcyclotetrasilazane, etc.

(3) Hydrocarbons

Saturated or unsaturated hydrocarbons which are gaseous at room temperature are often used alone or in admixture because of ease of operation. Examples include methane, ethane, propane, butane, pentane, ethylene, propylene, butene, butadiene, acetylene, methylacetylene, etc.

(4) Fluorocarbons or fluorinated hydrocarbons

Tetrafluoromethane, octafluoropropane, octafluorocyclobutane, tetrafluoroethylene, hexafluoropropylene, trifluorochloromethane, difluoromethane, trifluorobromomethane, difluoroethane, tetrafluoroethane, etc.

(5) Phosphorus compounds

Phosphine, phosphate esters, etc.

(6) Boron compounds

Diborane, borane trifluoride, etc.

(7) Nitrogenous hydrocarbons

Ethylene imine, methylamine, ethylamine, diethylamine, triethylamine, ethylene diamine, etc.

Nitrogen-containing fluorinated hydrocarbons are also included.

(8) Others

At least one of $NO_x$ (such as NO, $N_2O$, and $NO_2$), $H_2$, $O_2$, $O_3$, $H_2O$, $N_2$, $NH_3$, CO, and $CO_2$ may also be added to the above-enumerated reactant or reactants.

All the above-mentioned reactants may be used alone or in admixture of any desired combination. It is to be noted that the reactant(s) may contain O, Br, Cl or the like. If desired, sulfur and other trace elements may be added to the reactant(s) in minor amounts.

The ratio of reactants combined may be adequately selected so as to provide the desired composition of plasma-polymerized film without undue experimentation.

The plasma-polymerized film is formed by contacting a discharge plasma of the above-mentioned reactant(s) with a substrate which is a medium related member in the practice of the present invention.

The principle of plasma polymerization will be briefly described. When an electric field is applied to a gas kept at a reduced pressure, free electrons which are present in a minor proportion in the gas and have a remarkably greater inter-molecular distance than under atmospheric pressure are accelerated under the applied electric field to gain a kinetic energy (electron temperature) of about 5 to 10 eV. The accelerated electrons collide against atoms and molecules to fracture their atomic and molecular orbits to thereby dissociate them into normally unstable chemical species such as electrons, ions, neutral radicals, etc. The dissociated electrons are again accelerated under the applied electric field to dissociate further atoms and molecules. This chain reaction causes the gas to be instantaneously converted into highly ionized state. This is generally called a plasma gas. Since gaseous molecules have a less chance of collision with electrons and absorb little energy, they are kept at a temperature approximate to room temperature. Such a system in which the kinetic energy (electron temperature) of electrons and the thermal motion (gas temperature) of molecules are not correlated is designated a low temperature plasma. In this system, chemical species set up the state capable of additive chemical reaction such as polymerization while being kept relatively unchanged from the original. The present invention utilizes this state to form a plasma-polymerized film on a substrate. The use of a low temperature plasma avoids any thermal influence on the substrate.

Figure 3:
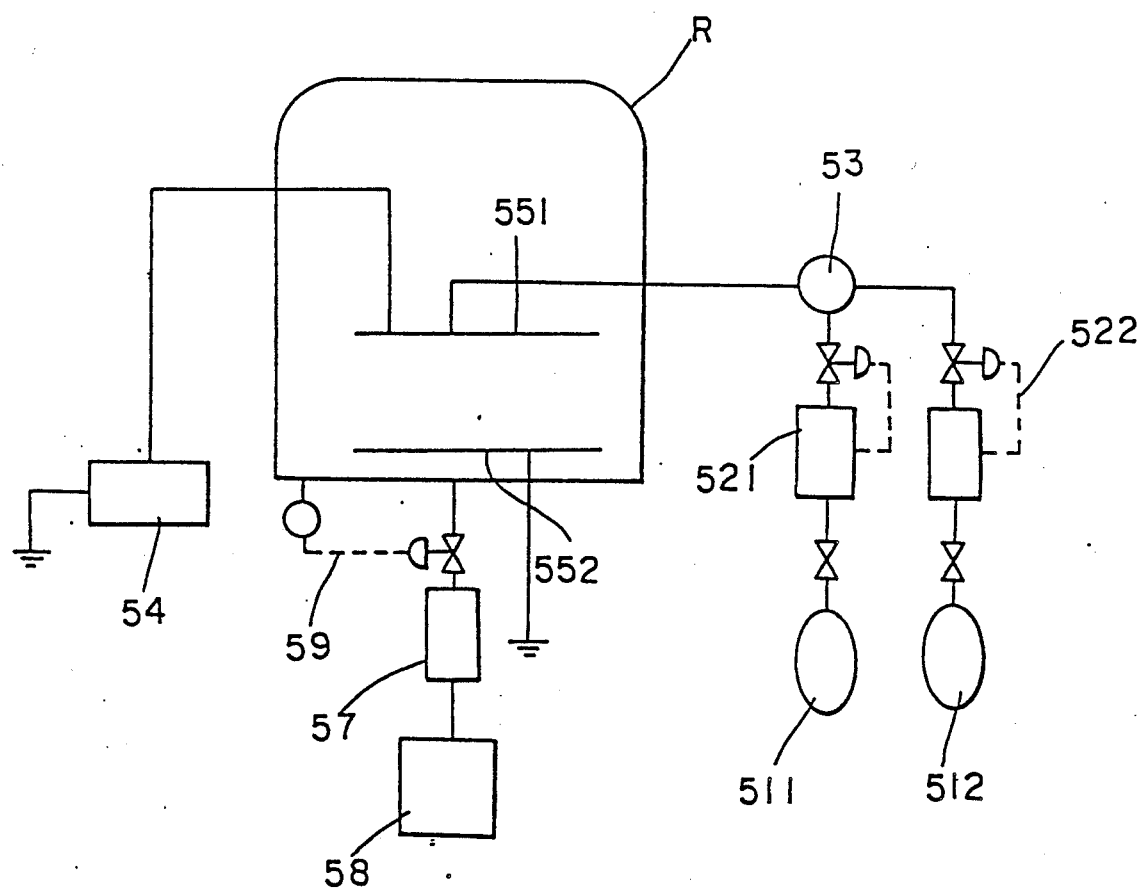
FIG. 3 is a schematic view of a plasma apparatus for preparing a polymerized film according to the present invention.

FIG. 3 is a schematic view illustrating an apparatus adapted to produce a plasma for forming a plasma-polymerized film according to the present invention. The apparatus is of a variable frequency power source type.

A gaseous polymerizable reactant as mentioned above is admitted into a reaction vessel R from a source 511 or 512 through a mass flow controller 521 or 522. When a mixture of such reactants is supplied from the gas sources 511 and 512, they are mixed in a mixer 53 before entering the vessel R. The reactants each may be fed at a rate of about 1 to 250 ml/min.

The vessel R includes a pair of opposed electrodes 551 and 552 defining a predetermined gap space therebetween. One electrode 551 is connected to a variable frequency power supply 54 while the other electrode 552 is grounded. Usually, the substrate rests on the electrode 552.

The reaction vessel R is further connected to a vacuum system for evacuating the interior of the vessel. The vacuum system generally includes a liquid nitrogen trap 57, an oil rotary pump 58, and a vacuum controller 59 and operates so as to keep the vessel interior at a vacuum of about 0.01 to 10 Torr.

In operation, the reaction vessel R is first evacuated to a vacuum of $10^{-3}$ Torr or lower by means of the oil rotary pump 58. Then a gaseous reactant or a mixture of gaseous reactants is admitted into the vessel at a predetermined flow rate. At this point, the vessel is maintained at a vacuum of 0.01 to 10 Torr. After a consistent flow rate of gaseous reactant is reached, the power supply 54 is turned on to generate a discharge plasma between the electrodes, depositing a plasma.polymerized film on the substrate surface.

A carrier gas may be used, for example, Ar, He, and $H_2$. It will be understood that the applied current, reaction time and other parameters for plasma polymerization may be properly selected within the commonly used ranges without undue experimentation.

The plasma generating power source used herein may be an RF, microwave, DC, or AC power source.

The plasma-polymerized film is formed on the substrate in this way, preferably on the plasma-treated surface of the substrate. Plasma pre-treatment of the substrate surface enhances the bond between the plasma.polymerized film and the substrate. The principle, method, and parameters of the plasma treatment of the substrate surface are essentially the same as described for plasma polymerization. The only difference is that the plasma treatment in principle uses an inorganic gas as the treating gas whereas the plasma polymerization uses an organic gas or gases (optionally containing an inorganic gas) as the reactant. The gas used for the plasma treatment is not particularly limited. Also, the frequency of a power source for plasma generation is not particularly limited and the source may be of DC, AC or microwave.

As described above, the plasma.polymerized film is formed on the plasma-treated surface of a substrate in the preferred embodiment of the present invention.

EXAMPLE

Examples of the present invention are given below by way of illustration and not by way of limitation. In the examples, SCCM is standard cubic centimeter, PET is polyethylene terephthalate, and POM is polyoxymethylene.

Experiment 1

Sheet samples were prepared by depositing plasma-polymerized films of 200 Å thick on one surface of PET sheets of 30 μm thick in a plasma-generating apparatus as shown in FIG. 3 where a plasma was produced by applying electricity at a power of 200 watts and a frequency of 13.56 MHz under an operating pressure of 0.05 Torr. The type and flow rate of gas reactants fed and the composition of the plasma-polymerized films are reported in Table 1. The compositions (F+Si+B+P+N) and (Si+B+P+N)/F of the plasma-polymerized films were measured by SIMS. The thickness of the films was measured by an ellipsometer.

The coated sheets were measured for coefficient of friction μ. The half life of electric charge was determined by charging the sheets with a voltage of 5,000 volts and measuring the time taken until the quantity of charge was reduced to one-half. In addition, the half life of electric charge was determined by the same procedure after the sheets were stored at 20° C. and RH 60% for 24 hours.

The results are shown in Table 2.

For comparison purposes, a sheet of the same material and thickness having no plasma-polymerized film thereon, that is, a control sample designated sample No. 20 and sheet samples having plasma-polymerized films outside the scope of the invention were also measured for the same properties as above. The results are also shown in Table 2.

TABLE 1

| Film No. | Gas | (SCCM) | Plasma-polymerized films reactants | (SCCM) | F + Si + B + P + N (at %) | (Si + B + P + N) /F |
|---|---|---|---|---|---|---|
| 1 | $CHF_3$ | 3 | $SiH(CH_3)_3$ | 7 | 17 | 0.85 |
| 2 | $CHF_3$ | 1 | $SiH(CH_3)_3$ | 9 | 19 | 0.42 |
| 3 | $CH_4$ | 5 | $BF_3$ | 5 | 30 | 0.41 |
| 4 | $C_3F_6$ | 2 | $SiH(CH_3)_3$ | 8 | 14 | 0.85 |
| 5 | $C_3F_6$ | 5 | $PH_3$ | 7.8 | 33 | 0.31 |
| 6 | $C_2F_4$ | 5 | $NH_3$ | 5 | 31 | 0.33 |
| 7 | $C_3F_6$ | 2 | $CH_3NH_2$ | 8 | 22 | 0.89 |
| 8 | $CH_4$ | 5 | $NF_3$ | 5 | 30 | 0.55 |
| 9 | $CClF_3$ | 2 | $CH_3NH_2$ | 8 | 16 | 1.5 |
| 10 | $CBrF_3$ | 5 | $CH_3NH_2$ | 5 | 25 | 0.51 |
| 11* | $C_2F_4$ | 10 | — | | 48 | — |
| 12* | $SiH(CH_3)_3$ | 10 | — | | 13 | — |
| 13* | $CH_4$ | 10 | — | | — | — |

TABLE 1-continued

| Film No. | Gas | (SCCM) | Plasma-polymerized films reactants | (SCCM) | F + Si + B + P + N (at %) | (Si + B + P + N) /F |
|---|---|---|---|---|---|---|
| 14* | $C_3H_8$ | 10 | $SiF_4$ | 1 | 4 | 0.29 |
| 15* | $CHF_3$ | 0.5 | $SiH(CH_3)_3$ | 20 | 13 | 6 |
| 16* | $CHF_3$ | 10 | $SiH(CH_3)_3$ | 1 | 39 | 0.05 |
| 17* | $C_3H_8$ | 9.5 | $NF_3$ | 0.5 | 1 | 0.53 |
| 18* | $C_2F_4$ | 10 | $NH_3$ | 1 | 52 | 0.08 |
| 19* | $CH_3F$ | 1 | $NH_3$ | 10 | 21 | 7 |

*outside the scope of the invention

TABLE 2

| Sample No. | Polymerized film No. | Coated sheets μ | Half-life (sec.) Initial | Half-life (sec.) Stored |
|---|---|---|---|---|
| 1 | 1 | 0.18 | 6 | 7 |
| 2 | 2 | 0.17 | 7 | 7 |
| 3 | 3 | 0.17 | 4 | 6 |
| 4 | 4 | 0.17 | 5 | 5 |
| 5 | 5 | 0.18 | 6 | 6 |
| 6 | 6 | 0.17 | 5 | 6 |
| 7 | 7 | 0.18 | 5 | 6 |
| 8 | 8 | 0.17 | 5 | 6 |
| 9 | 9 | 0.19 | 5 | 6 |
| 10 | 10 | 0.20 | 4 | 5 |
| 11* | 11 | 0.18 | >600 | >600 |
| 12* | 12 | 0.20 | >600 | >600 |
| 13* | 13 | 0.29 | >600 | >600 |
| 14* | 14 | 0.29 | 180 | 240 |
| 15* | 15 | 0.33 | >600 | >600 |
| 16* | 16 | 0.26 | >600 | >600 |
| 17* | 17 | 0.24 | 30 | 65 |
| 18* | 18 | 0.23 | >600 | >600 |
| 19* | 19 | 0.35 | >600 | >600 |
| 20* | — | 0.39 | >600 | >600 |

*outside the scope of the invention

Experiment 2

Samples were prepared by depositing plasma-polymerized films of 500 Å thick on the surface of stainless steel posts with a diameter of 4 mm in a plasma-generating apparatus as shown in FIG. 3. The plasma polymerization conditions and the composition of the resulting plasma-polymerized films were the same as in Experiment 1.

The coated posts were measured for coefficient of friction μ. The results are shown in Table 3.

For comparison purposes, a post of the same material and size, but free of a plasma-polymerized film (sample No. 40) and a POM post free of a plasma-polymerized film (sample No. 41) were similarly tested. The results are also shown in Table 3.

It is to be noted that the coefficient of friction μ is desired to be 0.25 or lower because smooth operation is not expected with higher coefficients of friction.

TABLE 3

| Sample No. | Polymerized film No. | μ |
|---|---|---|
| 21 | 1 | 0.15 |
| 22 | 2 | 0.12 |
| 23 | 3 | 0.14 |
| 24 | 4 | 0.14 |
| 25 | 5 | 0.15 |
| 26 | 6 | 0.14 |
| 27 | 7 | 0.15 |
| 28 | 8 | 0.12 |
| 29 | 9 | 0.16 |
| 30 | 10 | 0.17 |
| 31* | 11 | 0.14 |
| 32* | 12 | 0.16 |
| 33* | 13 | 0.22 |
| 34* | 14 | 0.23 |
| 35* | 15 | 0.25 |
| 36* | 16 | 0.18 |
| 37* | 17 | 0.18 |
| 38* | 18 | 0.17 |
| 39* | 19 | 0.26 |
| 40 (steel) | — | 0.27 |
| 42 (POM) | — | 0.37 |

*outside the scope of the invention

EXAMPLE 1

The following members:
leader/trailer tape section 121 (formed of PET),
guide post 151 (formed of POM),
tape pad 152 (formed of PET),
tape guide 153 (formed of POM),
guide roller 154 (formed of POM), and
reel center boss 1333 (formed of POM)
were coated on their surface with the same plasma-polymerized films as in Experiment 1 except that the films had a thickness of 500 Å. The coated members were assembled into a video cassette as shown in FIG. 1. The tape used was a PET film of 145 μm thick having a magnetic layer of cobalt-doped gamma-$Fe_2O_3$ magnetic powder formed thereon. For each of video cassettes, the components had the same plasma-polymerized film.

The thus fabricated video cassette samples were subjected to the following test.

Dropout

Each sample was measured for dropout before and after a 200-pass endurance test at 60° C. and RH 90%. The measurement method was by counting dropouts per minute on the video tape of standard 120-min. length and calculating the average. The result is an average of measurements on ten video cassettes for each lot.

The results are shown in Table 4.

TABLE 4

| Cassette sample No. | Plasma-polymerized film No. | Dropout, average count Initial | Dropout, average count After test |
|---|---|---|---|
| 51 | 1 | 6 | 7 |
| 52 | 2 | 5 | 5 |
| 53 | 3 | 6 | 6 |
| 54 | 4 | 6 | 7 |
| 55 | 5 | 7 | 8 |
| 56 | 6 | 8 | 8 |
| 57 | 7 | 8 | 9 |
| 58 | 8 | 7 | 8 |
| 59 | 9 | 8 | 9 |
| 60 | 10 | 8 | 9 |
| 61* | 11 | 8 | 16 |
| 62* | 12 | 8 | 15 |
| 63* | 13 | 8 | 15 |
| 64* | 14 | 8 | 12 |

TABLE 4-continued

| Cassette sample No. | Plasma-polymerized film No. | Dropout, average count | |
|---|---|---|---|
| | | Initial | After test |
| 65* | 15 | 8 | 13 |
| 66* | 16 | 8 | 13 |
| 67* | 17 | 8 | 12 |
| 68* | 18 | 8 | 11 |
| 69* | 19 | 8 | 13 |
| 70 (control) | none | 9 | 28 |

*outside the scope of the invention

In the test, each lot was rejected for commercial use if a count of more than 20 dropouts was recorded once or more for even one of the cassettes in the lot. For the lots according to the present invention, a count of more than 20 dropouts was not recorded at all.

In actual operation, the dropout canceller performs well so that less than 20 dropouts are not visually noticed.

EXAMPLE 2

The same plasma-polymerized films as in Experiment 1 were formed on the surface of the following members:
 leader tape section 221 (formed of PET, 125 μm thick),
 sheet 261 (formed of PET, 35 μm thick),
 guide pin 241 (formed of SUS), and
 guide roller 243 (formed of POM).
They were assembled into an audio cassette as shown in FIG. 2. The plasma-polymerized film had a thickness of 500 Å. The tape used was in the form of a PET film of C-90 length having a magnetic layer of cobalt-doped gamma-$Fe_2O_3$ magnetic powder formed thereon. For each of audio cassettes, the components had the same plasma-polymerized film.

The thus fabricated audio cassette samples were subjected to the following test.

Level-down

Each sample was measured for level-down after a 200-pass endurance test at 60° C. and RH 90%. An output level recorder Model 2307 of B & K Company was used for measurement without a filter and a signal of 10 kHz was recorded and reproduced at a chart speed of 0.3 mm/sec.

For each lot, ten cassettes were examined for reproduced signals before and after the endurance test. The cassette was evaluated "Rejected" if a level-down of more than 3 dB as compared with the value before the test was recorded once or more over the entire length of tape, but evaluated "Pass" if no such level-down was recorded.

The results are shown in Table 5.

TABLE 5

| Cassette sample No. | Plasma-polymerized film No. | Level-down |
|---|---|---|
| 71 | 1 | Pass |
| 72 | 2 | Pass |
| 73 | 3 | Pass |
| 74 | 4 | Pass |
| 75 | 5 | Pass |
| 76 | 6 | Pass |
| 77 | 7 | Pass |
| 78 | 8 | Pass |
| 79 | 9 | Pass |
| 80 | 10 | Pass |
| 81* | 11 | Rejected |
| 82* | 12 | Rejected |
| 83* | 13 | Rejected |
| 84* | 14 | Rejected |
| 85* | 15 | Rejected |
| 86* | 16 | Rejected |
| 87* | 17 | Rejected |
| 88* | 18 | Rejected |
| 89* | 19 | Rejected |
| 90 (control) | none | Rejected |

*outside the scope of the invention

The foregoing results demonstrate the effectiveness of the present invention.

There has been described a medium related member having a specific plasma-polymerized film formed on a surface thereof. Because of the nature of the plasma-polymerized film, the member of the invention has improved properties including significantly high antistatic properties, low dynamic friction, and high abrasion resistance.

Accordingly, a carrier using the members of the invention has advantages including antistatic properties, accurate, smooth and stable travel or movement of a recording/reproducing medium, and minimized dropouts.

Although some preferred embodiments have been described, many modifications and variations may be made thereto in the light of the above teachings. It is therefore to be understood that within the scope of the appended claims, the invention may be practiced otherwise than as specifically described.

We claim:

1. A recording and/or reproducing medium related member which constructs or is disposed in a casing in which a tape or disk-shaped medium is received for travel or rotating motion and is in sliding contact with said tape or disk-shaped medium, wherein
 a plasma-polymerized film is formed on a surface of said member wherein said film contains C, F and at least one element of Si, B, P, and N, the total content of F and at least one element of Si, B, P, and N ranging from 5 to 40 atom % of the film, and the atomic ratio of (Si+B+P+N)/F ranging from 2/10 to 5/1.

2. The medium related member of claim 1 wherein said plasma-polymerized film further contains H with an atomic ratio of C/H of up to 2/1.

* * * * *